(12) United States Patent
Carman et al.

(10) Patent No.: US 9,274,181 B1
(45) Date of Patent: Mar. 1, 2016

(54) MAGNETO-OPTIC FIELD COUPLING IN OPTICAL FIBER BRAGG GRATINGS

(71) Applicants: Gregory P. Carman, Los Angeles, CA (US); Panduranga K. Mohanchandra, North Hills, CA (US); Michael C. Emmons, Dublin, CA (US); William Lance Richards, Palmdale, CA (US)

(72) Inventors: Gregory P. Carman, Los Angeles, CA (US); Panduranga K. Mohanchandra, North Hills, CA (US); Michael C. Emmons, Dublin, CA (US); William Lance Richards, Palmdale, CA (US)

(73) Assignees: The United States of America, as Represented by the Adminstrator of NASA, Washington; The Regents of the University of California, Oakland, CA (US)

( * ) Notice: Subject to any disclaimer, the term of this patent is extended or adjusted under 35 U.S.C. 154(b) by 368 days.

(21) Appl. No.: 13/759,847

(22) Filed: Feb. 5, 2013

Related U.S. Application Data

(60) Provisional application No. 61/595,739, filed on Feb. 7, 2012.

(51) Int. Cl.
*G01R 33/02* (2006.01)
*G01J 1/04* (2006.01)
*G01R 33/032* (2006.01)
*G01R 3/00* (2006.01)

(52) U.S. Cl.
CPC ............... *G01R 33/032* (2013.01); *G01R 3/00* (2013.01)

(58) Field of Classification Search
CPC ............. G01M 11/30; G01M 11/3109; G01R 33/032; G01R 33/0322
USPC ................ 324/244.1, 244, 304, 389, 750.23, 324/754.23, 76.36, 753; 356/73.1, 73; 29/592.1
See application file for complete search history.

(56) References Cited

U.S. PATENT DOCUMENTS

| 4,575,179 | A | 3/1986 | Lee et al. | |
| 6,566,648 | B1* | 5/2003 | Froggatt | G01B 11/165 250/227.14 |
| 7,142,755 | B2* | 11/2006 | Kurusu et al. | 385/123 |
| 7,195,033 | B2 | 3/2007 | Mayeu et al. | |
| 2006/0103380 | A1* | 5/2006 | Kochergin | G01R 33/0322 324/244.1 |
| 2009/0034901 | A1* | 2/2009 | Takabayashi | B60K 15/077 385/12 |
| 2010/0128275 | A1* | 5/2010 | Chau | B82Y 15/00 356/445 |
| 2010/0171958 | A1* | 7/2010 | Chau et al. | 356/445 |
| 2010/0316328 | A1 | 12/2010 | Arias Vidal et al. | |

OTHER PUBLICATIONS

Novel Magentic Sensor Based on Fiber Bragg Grating and Magnetic Shape Memory Alloys, Ambrasino et al., 1st ICT, 2005.

* cited by examiner

*Primary Examiner* — Arleen M Vazquez
*Assistant Examiner* — Taqi Nasir
(74) *Attorney, Agent, or Firm* — Mark Homer

(57) ABSTRACT

The invention is a magneto-optic coupled magnetic sensor that comprises a standard optical fiber Bragg grating system. The system includes an optical fiber with at least one Bragg grating therein. The optical fiber has at least an inner core and a cladding that surrounds the inner core. The optical fiber is part of an optical system that includes an interrogation device that provides a light wave through the optical fiber and a system to determine the change in the index of refraction of the optical fiber. The cladding of the optical fiber comprises at least a portion of which is made up of ferromagnetic particles so that the ferromagnetic particles are subject to the light wave provided by the interrogation system. When a magnetic field is present, the ferromagnetic particles change the optical properties of the sensor directly.

9 Claims, 2 Drawing Sheets

MAGNETO-OPTIC FIELD COUPLING IN OPTICAL FIBER BRAGG GRATINGS

CLAIM OF PRIORITY TO PRIOR PROVISIONAL APPLICATION

This application claims priority under 35 U.S.C. 119(e) from the provisional application filed on Feb. 7, 2012, Ser. No. 61/595,739.

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

1. Field of the Invention

The present invention relates generally to optical fiber Bragg grating (FBG) sensors, specifically to incorporating particles into FBG sensors for magnetic field sensing, and most specifically to incorporating particles into the core and cladding of FBG sensors so that magnetic fields directly shift the reflected wavelength of light associated with an FBG sensor system.

2. Description of the Related Art

FBG sensors are made by "inscribing" or "writing" the periodic variation of refractive index into the core of a special type of optical fiber using an intense ultraviolet (UV) source such as a UV laser. This creates a grating that reflects a particular wavelength of light while transmitting others.

Over the past decade, optical FBG sensors have been used to measure a variety of physical characteristics such as temperature, strain, and pressure. Several inventions have been developed that attach magnetic materials directly or indirectly to an optical fiber containing Bragg gratings so that when such a fiber is subjected to a magnetic field, the magnetic materials subject the fiber to a physical deformation, which, in turn, can be measured by monitoring the strain-induced shift in reflected wavelength.

For example, see the following: U.S. Pat. No. 7,195,033 which discloses a fiber optic sensor scheme including magnetic sleeve that deforms the fiber in order to determine the position of the sleeve; U.S. patent application 2010/0316328 which discloses a fiber optic position transducer attached to a magnetic element to control a flow valve via a magnetic field; and, a paper presented at the 1$^{st}$ International Conference on Sensing Technology, 2005, Palmerston, North New Zealand titled "Novel Magnetic Sensor Based on Fiber Bragg Grating and Magnetic Shape Memory Alloys" discloses bonding a FBG optical sensor system to a piece of shape memory alloy in order to deform the optical fiber via a magnetic field.

It has also been shown that a magnetostatic wave can have an effect on optical wavelength in an optical system. For example, see U.S. Pat. No. 4,575,179 that discloses an optical signal processor device that employs a magnetorestrictive thin film, biased by a magnetic film that is placed within the path of an optical beam in order to diffract the beam.

However, a magnetic material has not been incorporated within an optical fiber itself in order to modify the optical wavelength of a fiber optic FBG system using a magnetic field.

Therefore, it is desired to provide an optical fiber with FBGs having a magnetic material incorporated directly within the fiber in order to modify the optical wavelength of the system through a magnetic field.

SUMMARY OF THE INVENTION

The invention proposed herein comprises a magnetic sensor utilizing direct magneto-optic field coupling in an optical fiber Bragg grating system.

Accordingly, it is an object of this invention to provide a magnetic sensor that couples with an optical system directly to modify the optical wavelength of the system through a magnetic field.

It is a further object of this invention to provide a magnetic sensor that utilizes direct magneto-optic field coupling by incorporating ferromagnetic particles within at least the cladding of an optical fiber with Bragg gratings.

This invention meets these and other objectives related to optical sensors by providing a magneto-optic coupled magnetic sensor that comprises a standard optical fiber Bragg grating system. The system includes an optical fiber with at least one Bragg grating therein. The optical fiber has at least an inner core and a cladding that surrounds the inner core. The optical fiber is part of an optical system that includes an interrogation device that provides a light wave through the optical fiber and a system to determine the change in the index of refraction of the optical fiber. The cladding of the optical fiber comprises at least a portion of which is made up of ferromagnetic particles so that the ferromagnetic particles are subject to the light wave provided by the interrogation system. When a magnetic field is present, the ferromagnetic particles change the optical properties of the sensor directly.

The invention also includes a method of making a magneto-optic coupled magnetic sensor by taking a optical fiber having at least a Bragg grating therein and removing the coating and at least a portion of the cladding of the optical fiber and replacing the removed cladding with ferromagnetic particles.

BRIEF DESCRIPTION OF THE DRAWINGS

In the drawings, which are not necessarily to scale, like or corresponding parts are denoted by like or corresponding reference numerals.

DESCRIPTION OF PREFERRED EMBODIMENTS

Figure 1:
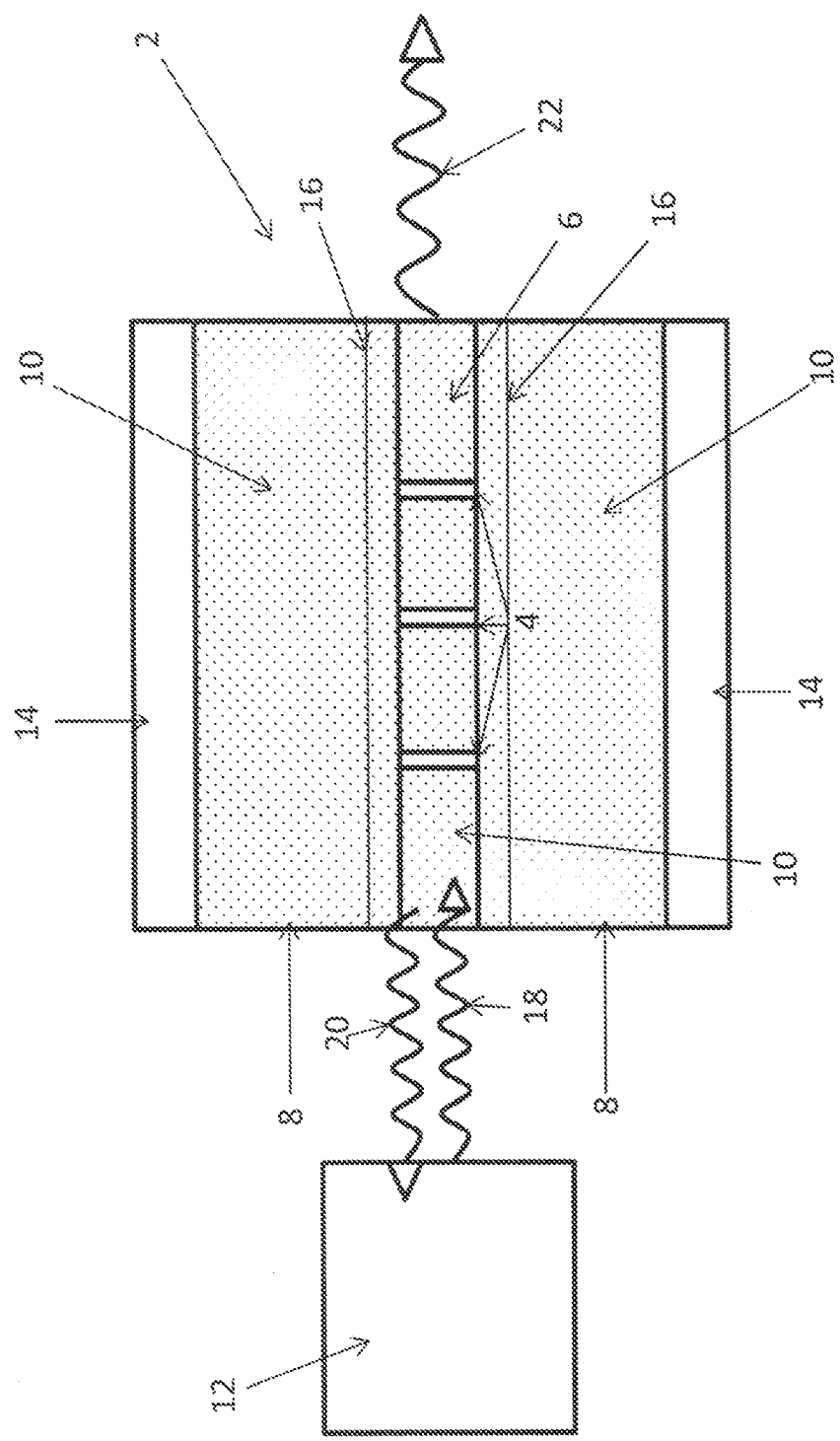
FIG. 1 depicts a diagram of an embodiment of the present invention.

Fiber Bragg grating (FBG) sensors are most commonly used to measure strain and temperature. These external stimuli produce an optically based change in index of refraction and a mechanically based change in length which combine to shift optical wavelength. Past devices have been developed with magnetically sensitive optical fibers by utilizing strain as a mechanism for producing wavelength shifts. In a more preferred method, the present invention directly couples the magnetic field with the propagating electromagnetic (EM) wave in the fiber by altering the effective index of refraction rather than using mechanical transduction or polarization rotation.

Optical interrogation systems that employ FBGs are well known in the art. For example, see U.S. Pat. No. 6,566,648, which is incorporated herein. These systems are generally made up of an optical fiber, a light source, and a computer which can determine the reflected wavelengths when the light source is directed along the optical fiber.

FBGs are gratings that are incorporated at specific locations within an optical fiber which cause an oscillation in the core index of refraction along the length of the fiber. FBGs reflect a particular wavelength of light while transmitting other wavelengths.

The light reflected by FBGs in such a system is governed by the equation:

$$\lambda_B = 2n\Lambda \qquad (1)$$

where $\lambda_B$ is the reflected wavelength; n is a composite index of refraction of the fiber (which is a function of the core index, cladding index, and core radius of the fiber); and $\Lambda$ is the period of core index modulation in units of length.

The invention, as embodied herein, takes advantage of the above relationship by replacing at least a portion of the cladding with ferromagnetic particles because the index of refraction of ferromagnetic particles changes in the presence of a magnetic field. Therefore, in the presence of a magnetic field, the reflected wavelength will change and be measurable via the optical interrogation system.

As used herein, the term "particles" includes objects that are small in at least one-dimension but that could be larger in the other two dimensions. Therefore, ferromagnetic fibers, discs, etc. embedded in the optical fiber are included when the term is used within this application. Ferromagnetic dopants are also included in the term "particles" as used herein. When the application refers to the "size" of a particle herein, it refers to the smallest dimension only. Therefore, when a particle size is noted to be 20 nanometers, this means that the object is 20 nanometers in its smallest dimension, but could be much larger in its other two dimensions.

Also, when this application denotes that a structure includes or is made up of a portion of ferromagnetic particles, this means that the ferromagnetic particles either represent all of the structure or that the ferromagnetic particles form a composite material with one or more other materials within the structure or that ferromagnetic dopants are introduced into the host FBG. Therefore, such a material make up creates a magnetically active phase within the structure.

In general, the invention comprises a magneto-optic coupled magnetic sensor. It employs a modified optical fiber with fiber Bragg gratings therein of the type used in optical fiber interrogation systems.

Optical fibers generally have an inner core, which is designed to guide a light source through the fiber, cladding surrounding the inner core, normally made of a material with a lower index of refraction to keep the light source within the fiber, and a coating, usually a type of polyimide, in order to physically protect the fiber. For certain optical systems, including the present invention, FBGs are imbedded within the core of the optical fiber at regular intervals to create a periodic variation of the refractive index within the inner core of the fiber.

For the present invention, a standard optical fiber as noted above is modified by removing the coating from the optical fiber and removing at least a portion of the cladding, which is replaced with ferromagnetic particles. The ferromagnetic particles need to be located within close enough proximity to the inner core of the optical fiber so that they interact with the light field propagating through the optical fiber. When such a modified optical fiber is within the presence of a magnetic field, the index of refraction of the cladding containing the ferromagnetic particles changes. Hence, when an interrogation system is used to interrogate the optical fiber with a light source, the reflected wavelength changes when in the presence of a magnetic field (versus when a magnetic field is not present).

Now referring to FIG. 1, the invention comprises an optical fiber 2, having at least one Bragg grating 4 placed therein. The number of Bragg gratings 4 can be selected by one skilled in the art depending upon the specific function of the optical fiber.

The optical fiber 2 comprises at least an inner core 6 and a cladding 8 which surrounds the inner core 6. At least a portion of the inner core 6, cladding 8, or a combination thereof surrounding the location of the Bragg grating(s) 4 comprises ferromagnetic particles 10. If the ferromagnetic particles 10 are only present in the cladding 8, the ferromagnetic particles 10 are located close enough to the inner core 6 so that when an optical interrogation system 12 sends a light source through the optical fiber 2, the propagating wave created by the light source (represented by the wave entering 18 the optical fiber 2, part of which is reflected 20, and part of which passes through 22 the optical fiber 2) reaches the ferromagnetic particles 10. The cladding 8 contains sufficient ferromagnetic particles 10 so that the refractive index of the cladding 8 is changed when the optical fiber is exposed to a magnetic field.

The inner core 6 is normally constructed of a transparent material such as glass (silica) or plastic. However, for the present invention, a portion of the inner core 6 may also contain ferromagnetic particles 10 for the same purpose as the ferromagnetic particles 10 within the cladding 8. In one embodiment of the invention, substantially all of the inner core 6 could contain ferromagnetic particles 10.

As noted above, the cladding 8 material is normally a transparent material chosen to have a lower index of refraction than the inner core 6 material to maintain the light within the waveguide portion of the optical fiber 2. Any portion of the cladding 8 that is not made up of ferromagnetic particles 8 will normally be such a standard material; however, the cladding 8 may be made up of substantially all ferromagnetic particles 10 (as long as the index of refraction of the inner core 6 is less than the index of refraction of the cladding 8). While one embodiment of the invention has ferromagnetic particles 10 packed around a sufficiently thin optical fiber 2, it is also possible to practice the present invention by suspending the ferromagnetic particles 10 within an oil or gel material to form at least a portion of the cladding 8.

In a preferred embodiment, the ferromagnetic particles 10 replace a majority of the standard cladding 8 material, thereby leaving a thin portion of standard cladding 8 material surrounded by the ferromagnetic particles 10. The location of the ferromagnetic particles 10 depends upon how far from the inner core 6 the light penetrates into the cladding 8 when a light source is introduced into the optical fiber 2 by the optical interrogation system 12. The present invention operates when the light source penetrates sufficiently into the cladding 8 so that it interacts with the ferromagnetic particles 10 so that in the presence of a magnetic field the index of refraction is modified (thus enabling the device to sense a magnetic field through simple optical interrogation). In a most preferred embodiment, the ferromagnetic particles 10 should be within about a maximum of 5 micrometers of the inner core 6. Lines 16 are representative of the maximum distance from the core that the ferromagnetic particles 10 should be placed. The portion of the cladding 8 that is made up of ferromagnetic particles 10 should be sufficient to ensure that the index of refraction of the cladding 8 is greater than the index of refraction of the inner core 6.

Any standard cladding 8 material that is replaced by ferromagnetic particles 10 that is not surrounding or adjacent to the Bragg grating(s) 4 does not substantially contribute to the magneto-optic coupling described herein. Therefore, to practice the present invention, at least a portion of the cladding 8 surrounding or adjacent to the Bragg grating(s) 4 must comprise ferromagnetic particles 10. Theoretically, the smallest distance along the Bragg grating(s) that would need to contain the ferromagnetic particles 10 is equal to the wavelength of the light reflected by the Bragg grating(s); however, from a practical perspective, more than a millimeter of cladding along the Bragg grating(s) length should contain the ferromagnetic particles 10. That said, the present invention can be practiced with any amount of cladding 8 greater than the length set forth above (including all of the cladding 8) containing at least a portion of ferromagnetic particles 10.

The ferromagnetic particles 10 have magnetic properties which are altered in a magnetic field and also modify the index of refraction when interacting with a light source. Non-limiting examples of preferred ferromagnetic particles of the present invention include cobalt, iron, ferrite, magnetite, yttrium iron garnet, or a combination thereof. The size of the magnetic particles of the present invention can range from about tenths of a nanometer to about 100 micrometers; however, it is preferred that the ferromagnetic particles 10 range in size from about 0.1-20 nanometers. As noted above, the sizes set forth herein are the smallest dimension of a three dimensional particle. Therefore, the ferromagnetic particles 10 of the present invention can be substantially uniform in size in the other two dimensions (e.g. nearly spherical) or can be larger, such as in fibers or disc shapes.

In a preferred embodiment of the invention, the optic fiber 2 also includes a coating 14 that surrounds the cladding 8 in order to provide physical protection for the fiber 2. The coating 14 can be any standard coating that is normally used on optical fibers. One preferred embodiment of the coating 14 is a polyimide material.

The invention also includes a method of making a magneto-optic coupled sensor. In general, the method involves taking a standard optical fiber that includes at least a Bragg grating, and preferably a plurality of Bragg gratings, therein and removing the coating and at least a portion of the cladding. The portion of the cladding removed would be replaced by ferromagnetic particles, either simply packing them around the remaining cladding or adding an oil or gel with ferromagnetic particles suspended therein.

As discussed above, the amount, location, and size of the ferromagnetic particles needs to be sufficient for light to reach the particles when interrogated by an optical interrogation system as described above so that in the presence of a magnetic field the index of refraction of the fiber is changed. This allows the optical interrogation system to create a propagating electromagnetic wave within the fiber so one can measure the optically based change in the index of refraction.

In a preferred embodiment of the invention, the coating may be removed by applying hot sulfuric acid to the optical fiber; while the portion of the cladding may be removed by applying hydrofluoric acid to the cladding.

In a most preferred embodiment of the invention, after at least a portion of the cladding is replaced by ferromagnetic particles, another layer of coating, similar to the one removed, is reapplied to the optical fiber It should be understood that the present invention may also be made by manufacturing the optical fiber core, including any desired percentage of ferromagnetic particles therein, applying a cladding which also may contain at least a portion being ferromagnetic particles, and applying a coating.

Experimental Example

Single mode optical fibers containing FBGs were used with a 5.4 µm core diameter, 127 µm cladding diameter, and 7 µm thick polyimide coating. The 4 cm long fiber strands contained four FBGs, each 0.5 cm in length and spaced 1 cm apart on center; however, only selected fiber optic locations were modified for magnetic sensing. The polyimide coating surrounding the selected FBGs was first removed with ~80° C. sulfuric acid. The specific FBGs were subsequently dipped in diluted hydrofluoric acid (24% by volume) to remove a portion of the cladding. FBG-1 was immersed in the hydrofluoric acid for 143 minutes while FBG-2 was immersed in the HF for 131 minutes resulting in diameters of 7.5 µm and 23 µm respectively. These two diameters were chosen in order to have approximately equal thermal effects while only the thinner FBG-1 produces changes in response to magnetic effects. This is because the evanescent field of light propagating through FBG-1 is present in the surrounding medium while the evanescent field in FBG-2 is contained entirely within the core and remaining cladding. Thus, FBG-2 is designed to be a control sensor whose thermal response is subtracted from FBG-1 in order to determine the magnetic influence on FBG-1.

The data reduction system used for calculating reflected wavelength utilizes optical frequency domain reflectometry. The process involves taking the wavelength domain reflection, using a Fourier transform to obtain the reflection in the length domain, windowing around the FBG of interest, and performing an inverse Fourier transform to obtain the selected FBG's wavelength domain reflection.

The ferromagnetic nanoparticles used are 98+% $Fe_3O_4$ and approximately 10-20 nm in size (manufacturer SkySpring Nanomaterials Inc). It is important to note that neither a carrier fluid nor epoxy was combined with the nanoparticles for this experiment. The magnetization versus magnetic field of the ferromagnetic nanoparticles was measured quasi-statically with a Quantum Design MPMS XL-5 SQUID magnetometer. The magnetic field was cycled from +10 kiloOersted (kOe) to −10 kOe and back over a ~3 hour period. The magnetization exhibited an expected nonlinear dependence of magnetization on magnetic field with magnetization saturation ($M_s$) of ±36.2 emu/g at field strengths greater than ±3 kOe with a slight remanent magnetization of ±2.3 emu/g.

For the test setup, the two optical fibers described above were encased in a non-magnetic structure to maintain fiber directionality with respect to the applied magnetic field. The structures were densely packed with nanoparticles to completely surround the etched region of each fiber. An incrementally increasing static magnetic field was applied laterally to the fibers using a Varian current-controlled electromagnet and measured with a F. W. Bell Model 6010 Gauss/Teslameter positioned within the magnetic field adjacent to the non-magnetic structures. Prior to testing, the test setup was allowed to reach thermal equilibrium with the electromagnet's cooling system turned on.

Experimental Results

The first magnetic field test was performed by switching a 5 kOe magnetic field on and off approximately every 45 seconds three times. The average shift in reflected wavelength in response to the magnetic field for FBG-1 was +25 µm (±2 µm standard deviation) while response of FBG-2 and the two unetched FBGs did not measurably change. The data was taken immediately after applying the magnetic field and thus, thermal influence should not be present in these tests. The difference between responses in FBG-1 and all other FBGs verifies the EM wave interaction with the $Fe_3O_4$ particles surrounding FBG-1 and the absence of interaction with FBG-2 and the unetched FBGs. This result eliminates magnetostriction from the FBGs' responses because any magnetostrictive influence would be observed in all FBGs, not just FBG-1. Furthermore, since the particles are not adhered to either fiber, the influence of magnetostriction is negligible. Therefore, this is believed to demonstrate a direct magneto-optic coupling between propagating light and the ferromagnetic nanoparticles.

Figure 2:
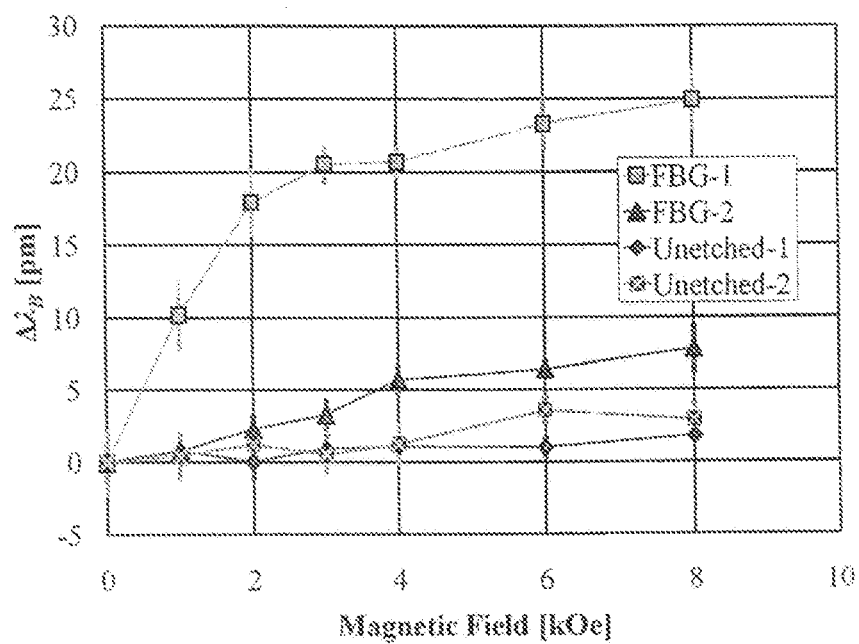
FIG. 2 is a graph showing experimental results of the magneto-optic coupling of the present invention.

FIG. 2 shows results of the second magnetic field test with a plot of the reflected wavelength of the FBGs versus the applied magnetic field levels. The symbols at each magnetic field level represent the average of five measurements and the error bars represent the standard deviation. The magnetic field levels were held for a sufficient amount of time prior to measurements in order to achieve thermal equilibrium. As the magnetic field increases from 0 to 8 kOe, FBG-1 shows a nonlinear dependence on magnetic field which is greater at low fields and decreases at high fields (i.e. >3 kOe) beyond the $Fe_3O_4$ saturation field. In contrast, FBG-2 and the two unetched FBGs have a nearly linear increase in the reflected wavelength. The linear shifts are attributed to thermal effects induced by the electromagnet used in the test. As field increases, temperature increases and is verified with a thermocouple. The etched (FBG-1) and unetched (Unetched-1) gratings on the same fiber exhibit different thermal behavior due to the difference in amount of cladding which influences local temperatures. However, because the two unetched FBGs on separate fibers exhibit similar thermal behavior, we conclude that both fibers experience equivalent thermal environments and thus, we can use FBG-2 as a control for FBG-1. Additionally, because the iron oxide is not adhered to FBG-1 or -2 during testing, the rather small difference in cladding coefficients of thermal expansion need not be considered. To filter out the thermal influence on FBG-1, we use FBG-2 as our control for temperature change. The thermal effects are relatively small (<10 μm) which indicates the electromagnet's cooling system is keeping the temperature of the system reasonably stable. However, these small, thermally induced wavelength shifts must be tracked because they represent a significant portion of the overall wavelength shift (e.g. ~30% at 8 kOe). Additionally, tracking the thermal influence helps to explain why FBG-1 continues to increase its reflected wavelength when magnetic fields >3 kOe are applied and the magneto-optic effect has saturated.

What is described are specific examples of many possible variations on the same invention and are not intended in a limiting sense. The claimed invention can be practiced using other variations not specifically described above.

What is claimed is:

1. An optical fiber, having at least one fiber Bragg grating therein, for magneto-optic field coupling, comprising:
    at least an inner core and a cladding surrounding the inner core; and,
    an optical interrogation system that provides a propagating electromagnetic wave within the fiber to measure the optically based change of index of refraction within the optical fiber;
    wherein at least a portion of the inner core, the cladding, or a combination thereof comprises at least a portion of ferromagnetic particles adjacent to the at least one fiber Bragg grating, so that the ferromagnetic particles are exposed to the propagating electromagnetic wave in an amount sufficient to modify the optical index of refraction when the fiber is exposed to a magnetic field.

2. The optical fiber of claim 1, wherein the ferromagnetic particles comprise a size of about 0.1 nanometer to about 100 micrometers in one dimension.

3. The optical fiber of claim 2, wherein the ferromagnetic particles comprise a size of about 0.1 to about 20 nanometers in one dimension.

4. The optical fiber of claim 1 wherein the ferromagnetic particles are selected from the group of cobalt, iron, ferrite, magnetite, yttrium iron garnet, or a combination thereof.

5. The optical fiber of claim 1, wherein the ferromagnetic particles are within about 5 micrometers from the inner core.

6. The optical fiber of claim 5, wherein the entire cladding comprises ferromagnetic particles.

7. The optical fiber of claim 6, wherein at least a portion of the inner core comprises ferromagnetic particles.

8. The optical fiber of claim 1, wherein the portion of the inner core, cladding, or combination thereof comprising ferromagnetic particles adjacent to the fiber Bragg grating is at least one millimeter in length.

9. The optical fiber of claim 1, wherein the optical fiber comprises a plurality of fiber Bragg gratings and at least a portion of the cladding adjacent to the plurality of fiber Bragg gratings comprises ferromagnetic particles.

* * * * *